Jan. 31, 1967 J. O. PREISIG 3,302,056

TRANSISTOR PROTECTION CIRCUITS

Filed March 8, 1963 2 Sheets-Sheet 1

INVENTOR.
JOSEPH O. PREISIG

BY

W. H. Sponagle

ATTORNEY

Jan. 31, 1967 J. O. PREISIG 3,302,056

TRANSISTOR PROTECTION CIRCUITS

Filed March 8, 1963 2 Sheets-Sheet 2

INVENTOR.
JOSEPH O. PREISIG
BY
W. H. Spoungle
ATTORNEY

United States Patent Office 3,302,056

Patented Jan. 31, 1967

3,302,056

TRANSISTOR PROTECTION CIRCUITS

Joseph O. Preisig, Trenton, N.J., assignor to Radio Corporation of America, a corporation of Delaware Filed Mar. 8, 1963, Ser. No. 263,842
4 Claims. (Cl. 315—27)

Figure 1:
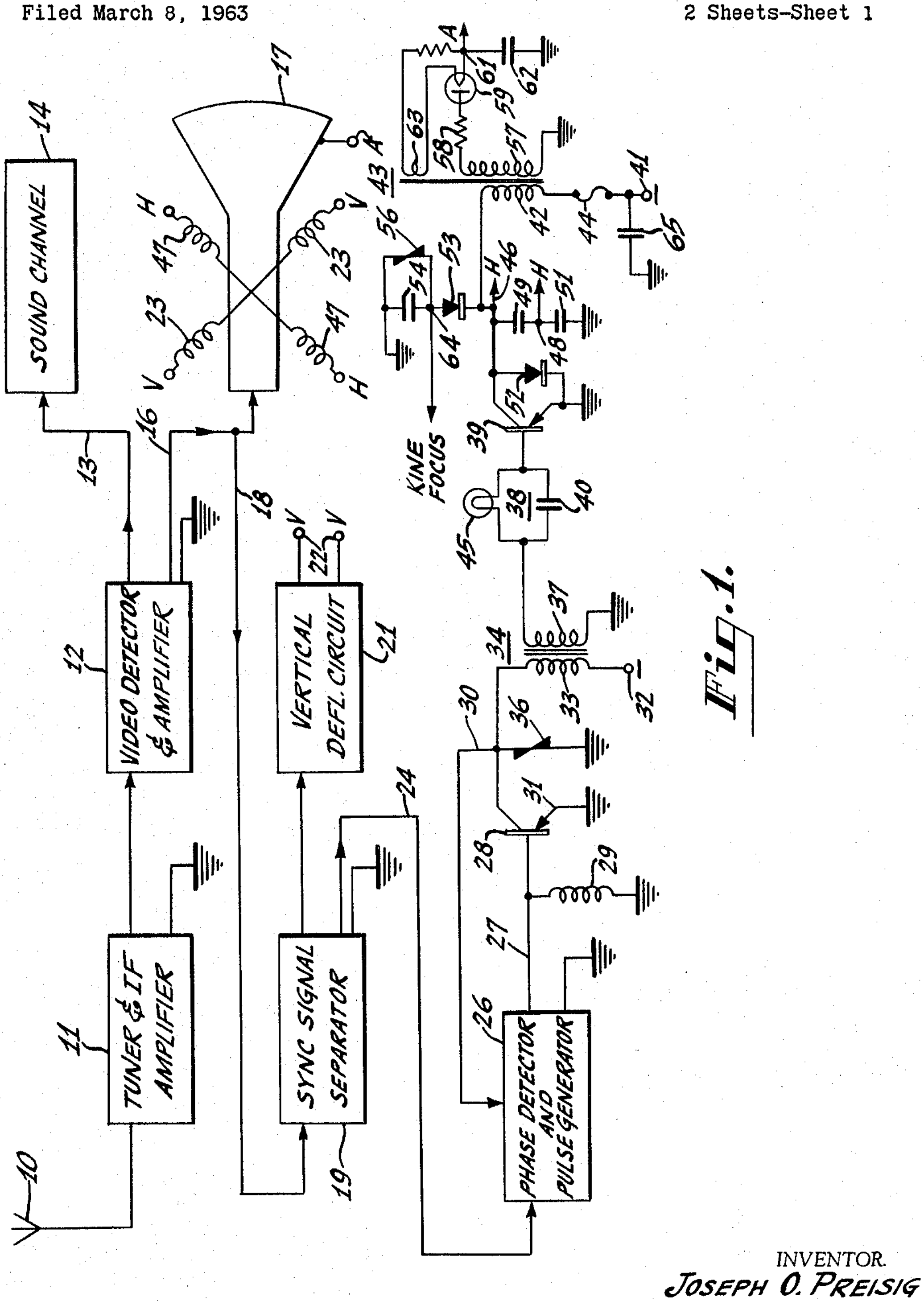

The present invention relates to transistor protection circuits. More particularly the present invention relates to circuit arrangements for preventing the destruction of transistors due to high current or voltage impulses of short duration.

Many electronic circuits using semiconductive devices such as transistors must be carefully designed so that the operating characteristic of the semiconductive device will be compatible with the demands of the circuit. Unlike electron tubes, semiconductive devices may be unable to recover from certain transient circuit conditions containing unusually high currents or voltages. For this reason many transistors having operating characteristics capable of withstanding normal steady-state circuit conditions may be destroyed by unexpected instantaneous transients.

In the horizontal deflection circuits of a television receiver, for example, the horizontal output circuit generally produces a sawtooth current for the electromagnetic deflection of the electron beam in the cathode ray tube. This circuit generally also produces the high ultor potential also applied to the cathode ray tube.

In transistorized television deflecting circuits and in many other transistor circuits driving an inductive load, high voltages may be produced by the change in current flow through the inductive load. While it may be possible to obtain transistors having operating characteristics capable of withstanding the regularly occurring high voltage and current pulses, unexpected transient conditions may cause excessive voltage or current to be applied to the transistor for a short time period which may still be sufficient to destroy the transistor.

Accordingly, it is an object of the present invention to provide a new and improved transistorized circuit arrangement having means for protecting the transistor from being destroyed by transient circuit conditions.

A second object of the present invention is to provide a new and improved transistor protection circuit arrangement for use with transistors driving an inductive load.

Another object of the present invention is to provide a new and improved transistorized horizontal deflection circuit for television receivers.

With the above objects in view the present invention contemplates a circuit arrangement including means for providing a source of operating potential for the transistor to be protected for normally maintaining it in conductive condition. Means are connected to the input circuit of the transistor for periodically rendering it nonconductive. A load circuit connected to the output circuit of the transistor responds to the conductive and nonconductive conditions of the transistor to produce first voltage impulses related to the conductive and nonconductive periods of the transistor. The load circuit also is subject to the production of randomly occurring second voltage impulses having a larger amplitude than the first voltage impulses. Protective circuit means are connected to the output circuit of the transistor and are operative in response to the second, random voltage impulses for preventing these voltage impulses from adversely affecting the transistor.

Figure 2:
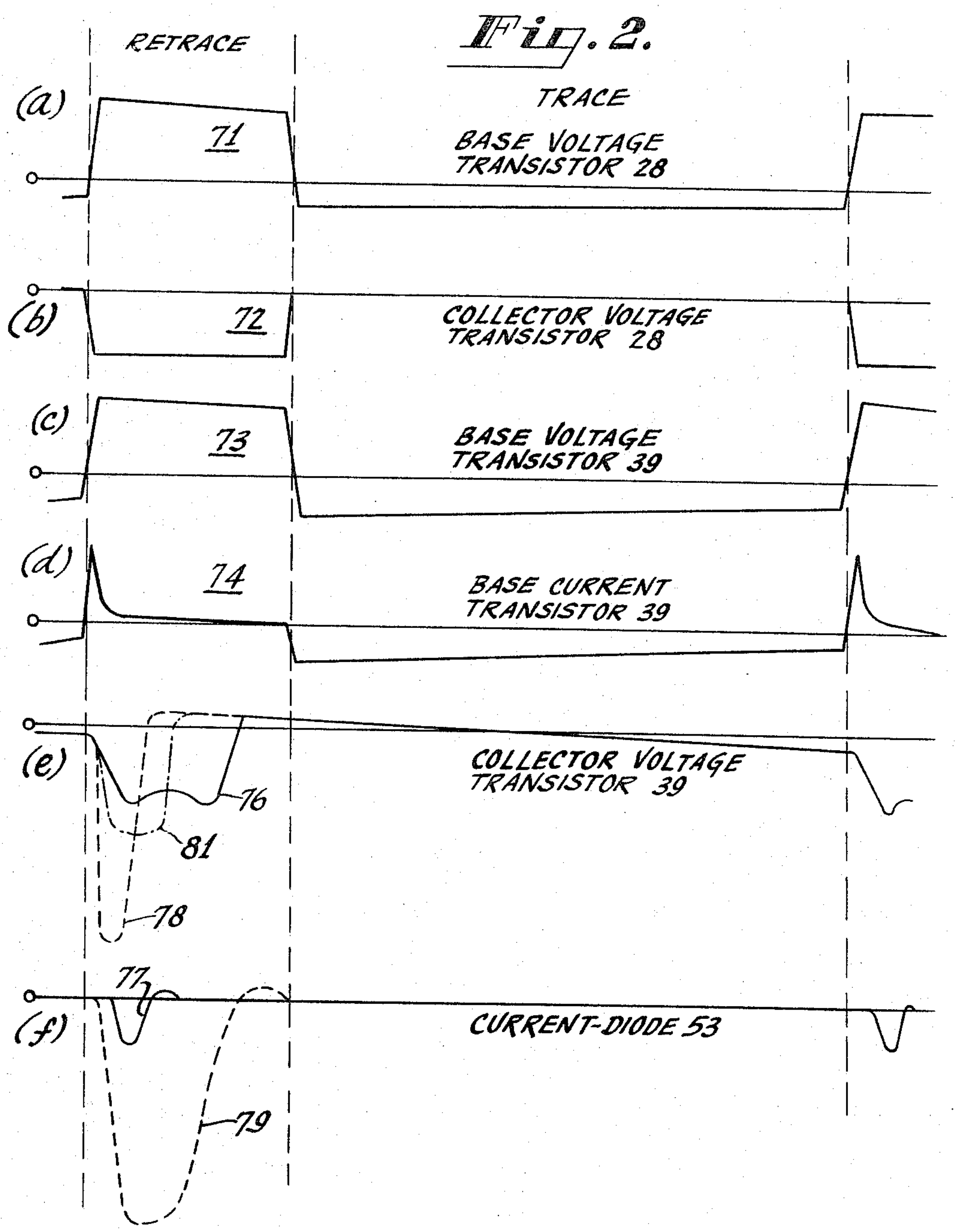

The novel features which are considered as characteristic for the invention are set forth in particular in the appended claims. The invention itself, however, both as to its construction and its method of operation together with additional objects and advantages thereof will best be understood from the following description of specific embodiments when read in connection with the accompanying drawings in which:

FIGURE 1 is a schematic diagram partially in block form of a television receiver illustrating a horizontal deflection circuit arrangement constructed in accordance with the principles of the present invention; and FIGURE 2 including sub-figures 2(*a*)–2(*f*) is a graphical representation of waveforms occurring at different points in the circuit of FIGURE 1.

Referring to the drawings and more particularly to FIGURE 1, television signals transmitted from a broadcasting station are picked up by the antenna 10 of the television receiver and applied to the radio frequency (RF) tuner. The block 11 represents the RF tuner and the intermediate frequency (IF) amplifier of the television receiver. The IF output from block 11 is applied to the video detector and amplifier represented by the block 12. The operation of the circuits represented by the blocks 11 and 12 are not essential for the understanding of the principles of the present invention and accordingly details thereof are not illustrated in order to avoid unnecessarily complicating the drawing.

The apparatus represented by the blocks 11 and 12 demodulated the received television signal and applies the audio component of the demodulated signal on conductor 13 to a sound channel 14. It applies the video component on conductor 16 to a cathode ray tube 17 and on conductor 18 to a synchronizing signal separator 19. The sound channel represented by the block 14 reproduces the audio information contained in the television signal in synchronism with the displayed image on the cathode ray tube 17.

The cathode ray tube or kinescope 17 reproduces the image represented by the television video signal and the synchronizing signal separator 19 separates the vertical and horizontal synchronizing signals which are present in the received television signal. The vertical synchronizing signal is applied from the sync separator 19 to the vertical deflection circuit 21 and synchronizes the generation of generally sawtooth shaped pulses which are produced at the output terminals 22 of the circuit 21 and applied to the terminals V—V of the vertical deflection coils 23 of the cathode ray tube 17.

The sound channel, synchronizing signal separator and vertical deflection circuits may each be constructed in any one of several conventional configurations to carry out its respective function. Again complete details of these circuits are not illustrated to avoid unnecessarily complicating the drawing.

The horizontal synchronizing signals are applied on a conductor 24 to phase detector and pulse generator 26. In pulse generator 26 the horizontal synchronizing signal is integrated and amplified. The horizontal synchronizing pulses are thus separated from the vertical synchronizing pulses present in the output of the sync separator 19. The resulting polarity and time sensitive D.C. signal is applied to the pulse generator. Accordingly, emitted at the output of the generator 26 are pulses occurring at the proper horizontal deflection frequency which pulses have been corrected in phase and have been synchronized by the horizontal synchronizing signals.

These pulses are applied from the generator 26 on conductor 27 to the base electrode of driver transistor 28. The base electrode is also connected to the emitter electrode of transistor 28 by an inductor 29.

The emitter electrode of the PNP transistor 28 is connected directly to a datum potential or ground for the television receiver by conductor 31 and the collector electrode of transistor 28 is connected to the negative terminal 32 of a source of operating potential (the positive terminal of which is grounded) through the primary winding 33 of a transformer 34. The collector electrode of transistor 28 is also connected to the emitter electrode of this transistor by means of a voltage dependent resistor (VDR) 36. The VDR or varistor 36 has a nonlinear resistance characteristic. That is, its resistance decreases with increase in the voltage applied thereacross. The collector of transistor 28 is connected to detector and generator 26 by conductor 30 for phase detection purposes.

The transformer 34 has a secondary winding 37 having one end thereof connected to ground and the other end thereof connected through a network 38 to the base electrode of a horizontal output transistor 39. The network 38 consists of a capacitor 40 arranged in parallel with a nonlinear resistor 45. Resistor 45 may actually be an incandescent lamp as illustrated or a resistor having an operating characteristic such that its resistance increases with increasing current flowing therethrough.

The emitter electrode of the PNP transistor 39 is connected directly to ground while the collector electrode thereof is connected to the negative terminal 41 of a source of operating potential by means of the primary winding 42 of high voltage transformer 43 and a fuse 44. This collector electrode is also directly connected to a terminal 46 which in turn is connected to one terminal H of the horizontal deflection coil 47 of the cathode ray tube 17. The other terminal H of coil 47 is connected to a terminal 48 which is at the junction between capacitors 49 and 51. The other side of capacitor 51 is directly connected to ground while the other side of capacitor 49 is connected to the collector electrode of the output transistor 39.

Connected between the collector electrode of the transistor 39 and its emitter electrode is the damper diode 52. Also connected to the collector electrode of the transistor 39 is a peak detector circuit consisting of a diode 53 in series with a capacitor 54. Connected across the capacitor 54, which has one terminal thereof connected to ground for the television receiver, is a second voltage dependent resistor or varistor 56 having a resistance which varies inversely with the voltage applied thereacross.

The high voltage transformer 43 has a secondary winding 57 having one end thereof connected to ground and the other end connected through a current limiting resistor 58 to the anode of a high voltage rectifier 59. The cathode of the rectifier 59 is connected to a terminal 61 which in turn is directly connected to the ultor A of the cathode ray tube 17. Terminal 61 also is connected to ground by means of filter capacitor 62. Heater voltage for the rectifier 59 is obtained from a winding 63 on the transformer 43.

In operation, generator 26 produces positive going pulses 71 as shown in FIGURE 2(*a*) occurring at the desired repetition rate for horizontal scanning purposes. A positive pulse applied to the base electrode of the driver transistor 28 cuts off collector-emitter current flow through this PNP transistor applying a negative pulse 72 as shown in FIGURE 2(*b*) to the primary winding 33 of transformer 34.

The varistor 36 helps to absorb the energy stored in the primary winding 33 by loading the winding down with a low resistance for any high voltage pulse appearing across the primary winding. This prevents the voltage waveform 72 at the collector of the driver transistor 28 from going through a series of damped oscillations of a frequency determined by the inductance of the primary winding 33 and the distributed capacitance. That is, the VDR 36 has a low resistive value when a high voltage is placed thereacross and a high resistance when the potential at its terminals is low. Thus, the driver transistor 28 is protected from destruction by sharp voltage pulses that might otherwise be applied thereto at its collector due to the cut-off of current flow to the primary winding 33 of the transformer 34.

The large negative pulse 72 applied to primary winding 33 produces a positive going pulse in the secondary winding 37 as shown by the waveform 73 of FIGURE 2(*c*). This positive pulse is applied to the base electrode of the horizontal output transistor 39 by means of the network 38.

The application of the positive pulse 73 to the base electrode renders the transistor 39 nonconductive. Scanning (trace) current which had been flowing through the horizontal deflection coils 47 of the cathode ray tube 17 is abruptly terminated when transistor 39 ceases to conduct. Retrace current is produced by the energy stored in the horizontal deflection coils 47 which now discharges through the capacitor 49 in a half wave oscillatory manner.

Termination of the positive pulses 71 and 73 respectively applied to the base electrodes of transistors 28 and 39 restores the normal forward biasing conditions for these transistors and starts the trace portion of the scanning cycle anew. The damper diode 52 conducts during the beginning of the horizontal deflection (trace) cycle increasing the current flow through the horizontal coils 47 in a linear manner which will be continued by current flow through the transistor 39 in accordance with reaction scanning techniques. The damper diode 52 thus supplements the imperfect symmetry of transistor 39 in its function as a bipolar switch. Also, diode 52 eliminates the necessity for initiating conduction of transistor 39 with great precision.

The base current flowing through transistor 39 is represented by the solid line waveform 74 in FIGURE 2(*d*). It can be seen that this current reverses to form a fast discharge current peak which determines turn-off time for transistor 39. This high, fast reverse base discharge current is carried mainly by capacitor 40. The discharge current is then carried and limited by nonlinear resistor 45. It is possible for the base breakdown voltage of the transistor 39 to be exceeded during this turn-off period. Since current through the transistor under breakdown conditions increases faster than the driving voltage it is possible for runaway to occur, thereby destroying the transistor.

This is avoided by the nonlinear resistor 45 having a resistance which increases with increasing current. This resistor limits base current flow in the transistor 39 to prevent runaway. The resistor 45 also limits transistor breakdown notwithstanding differences in transistor breakdown voltages which may exist in one transistor or another used as transistor 39 due to tolerances in production. Thus the voltage dependent resistor 36 and the current dependent resistor 45 shape the base driving current of transistor 39 to produce very fast base discharge and very small breakdown base currents for this transistor.

The voltage normally appearing at the collector electrode of transistor 39 is shown by the solid line waveform 76 in FIGURE 2(*e*). Also, solid line waveform 77 of FIGURE 2(*f*) indicates normal current flow through diode 53. For a TAE 1928 transistor, for example, having collector-emitter biasing potential of −40 volts, the peak voltages of waveform 76 in FIGURE 2(*e*) may be in the order of 250 volts. Similarly, the peak of the diode current represented by the waveform 77 would be in the order of one ampere.

The alternate conductive and nonconductive conditions of transistor 39 also produce abrupt changes in the flow of current through the primary winding 42 of the high voltage transformer 43. These abrupt changes produce high voltage impulses in the secondary 57 which are rectified by high voltage rectifier 59 and applied from terminal 61 to the ultor A of the cathode ray tube 17. As described in my U.S. Patent 3,030,444, issued April 17, 1962, the rectifier 53 and capacitor 54 form a peak detection circuit, producing at the junction point 64 a direct voltage which may be used as a power source for some of the preceding video circuits in the television receiver. This voltage may also be used, for example, for the focussing electrode in the cathode ray tube 17.

Briefly, as discussed in the above-mentioned patent the peak detection circuit made up of the rectifier 53 and capacitor 54 limits the voltage at the collector electrode of the transistor 39 for the regularly occurring retrace voltage impulses. This voltage is limited by the transfer of energy from the horizontal coils 47 through the diode 53 to capacitor 54 which is relatively large. An equilibrium condition is established when the energy stored in the capacitor 54 (while the transistor is in its nonconductive state) equals the energy consumed by whatever load resistance is connected to the junction 64.

However, it is possible that additional voltage impulses will be developed at the collector electrode of the transistor 39 in a randomly occurring manner. For example, the high voltage rectifier 59 may break down and substantially short circuit the secondary winding 57 of the transformer 43. The leakage inductance will thus appear in parallel with the horizontal deflection coils 47 increasing the current, voltage and energy to be dissipated at the collector of transistor 39. The voltage impulses so produced would have an amplitude substantially higher than the amplitude of the regularly occurring reversed polarity pulses appearing at the primary winding 42.

One such instantaneous voltage impulse is represented in FIGURE 2(*e*) by the dotted waveform 78. The peak amplitude of such an impulse may be in the order of 720 volts for example. A corresponding diode 53 current flow indicated in FIGURE 2(*f*) by the waveform 79 would normally be developed by such instantaneous high voltage impulse. Waveform 79 might have a peak amplitude of between 5–10 amperes which may last from 2–3 microseconds as compared to the normal one microsecond, one ampere, diode current flow. The transistor 39 is protected from this heavy current by the action of the varistor 56 connected in parallel with capacitor 54. The energy due to the heavy current is bypassed into the load circuit made up of capacitor 54 and varistor 56 in parallel. Most of the energy of short energy surges is absorbed by the capacitor 54. A longer energy surge produces a higher voltage across the varistor 56, decreasing its resistance so that more of the longer energy rise is absorbed by the varistor 56. The longer energy rise is also reflected by increasing D.C. current which will eventually burn out the fuse 44 further to protect the transistor 39.

The VDR or varistor 56 arranged in parallel with the capacitor 54 prevents such instantaneous high voltage impulses from being applied to the transistor and reduces such impulse to the dotted waveform 81 shown in FIGURE 2(*e*). According, for the regularly occurring voltage impulses 76 which cause diode 53 to conduct, the resistance of varistor 56 is quite high and has little effect on the normal operation of the detection function of diode 53 and capacitor 54. However, when a randomly occurring high voltage impulse 78 appears, the increased voltage applied across the varistor 56 substantially reduces its resistance causing most of the current available at the collector electrode of the transistor 39 to flow therethrough and prevents any of this energy from adversely affecting the transistor 39 or the voltage produced at the junction 64.

Thus, the output transistor 39 is protected against the randomly occurring high voltage impulses which may be two to three times as high as the regularly occurring high voltage impulses applied across the transistor.

It should be noted that the high voltage rectifier 59 is often able to withstand the instantaneous voltage breakdowns and recover its normal operation. The resistor 58 in series with rectifier 59 prevents a complete short circuit of the high voltage winding 57 due to rectifier 59 breakdown. Also, electron tubes used for horizontal drivers and horizontal output tubes in conventional television receivers may be able to withstand such applied high voltage without adverse effects on the operation thereof. However, without the varistor 56, the output transistor 39 may be very quickly destroyed even though the high voltage rectifier 59 recovers its normal operation.

It is possible that the high voltage rectifier 59 may become defective and continually break down. Also, some other failure in the circuit may tend to produce a high voltage at the collector electrode of the transistor 39 and resultant high current flow for time periods substantially longer than the several microseconds taken by the instantaneous voltage breakdown. For example, the secondary winding 57 of transformer 43 may be inadvertently shorted during servicing. To protect the output transistor from such conditions, the fuse 44 is arranged in series with the collector electrode of the transistor 39 and will open at its preselected current value. Such value is chosen to be somewhat greater than the normal A.C. and D.C. current flow through the fuse. Accordingly, any larger current flow will burn out the fuse 44 to protect the transistor 39.

It should be noted that the fuse 44 is arranged to be on the opposite side of the bypass capacitor 65 with respect to the negative terminal 41 of the operating potential source. In this way any current tending to flow through transistor 39 due to the energy stored in capacitor 65 under breakdown conditions will also flow through the fuse providing maximum protection.

As pointed out above the varistor 56 protects the output transistor 39 due to its nonlinear characteristic. Therefore, other elements having such characteristics may also be used. For example, a zener diode or an activated neon bulb may be substituted for the varistor 56. Also, a varistor may be used for the diode 53 due to the pulsed operation of the circuit which uses only one side of the varistor characteristic which is equivalent to a diode. Such arrangement will also provide effective protection for the output transistor 39. Both the varistor and the zener diode are effectively automatically "resettable" so that they are ready to protect the transistor against the next randomly occurring pulse as soon as the first one has ended.

The transistors for the driver and output stages have been illustrated as PNP transistors. However it should be apparent that NPN transistors may be used by proper arrangement of the polarity of the biasing potentials.

While the present invention has been described in connection with a transistorized horizontal deflection stage for a television receiver, it should also be apparent that the protective features contained therein may be utilized to prevent the destruction of semiconductive devices such as transistors in other types of circuits, particularly those having an inductive load.

What is claimed is:

1. In an electron beam deflection circuit for a television receiver in combination, a driver stage having a first transistor with input and output circuits;

a first resistor having a nonlinear resistance characteristic connected to the output circuit of said first transistor;

means connected to the input circuit of said first transistor for alternately rendering said transistor conductive and nonconductive;

an inductively loaded output stage having a second transistor with input and output circuits, said output circuit of said first transistor being connected to said input circuit of said second transistor for respectively rendering said second transistor conductive and nonconductive in response to the conductive and nonconductive conditions of said first transistor whereby said inductive output stage develops first voltage impulses at a rate related to the conductive and nonconductive periods of said second transistor and is further subject to the development of randomly occurring second voltage impulses having an amplitude substantially higher than the amplitude of said first voltage impulses;

peak detecting means connected in circuit with said output circuit of said second transistor for developing a voltage having an amplitude related to the amplitude and repetition rate of said first voltage impulses;

and protective circuit means including a second resistor having a nonlinear resistance characteristic connected to said output circuit of said second transistor for preventing said second voltage impulses from adversely affecting the operation of said second transistor.

2. In a transistorized electron beam deflection circuit for a television receiver in combination, a driver stage having a first transistor with base, collector and emitter electrodes;

means connected to said base electrode of said first transistor for alternately rendering said transistor conductive and nonconductive;

a first resistor connected to said collector and emitter electrodes of said first transistor, said first resistor having a nonlinear resistance characteristic;

an inductively loaded output stage having a second transistor with base, emitter and collector electrodes, said base electrode of said second transistor being connected in circuit with said collector electrode of said first transistor for respectively rendering said second transistor conductive and nonconductive in response to the conductive and nonconductive conditions of said first transistor whereby said inductive output stage develops first voltage impulses at a rate related to the conductive and nonconductive periods of said second transistor and is further subject to the development of randomly occurring second voltage impulses having an amplitude substantially higher than the amplitude of said first voltage impulses;

a second resistor having a nonlinear resistance characteristic connected in circuit with said base electrode of said second transistor;

peak detecting means connected in circuit with said collector electrode of said second transistor for developing a voltage having an amplitude related to the amplitude and repetition rate of said first voltage impulses;

and protective circuit means including a third resistor having a nonlinear resistive characteristic connected to said collector electrode of said second transistor for preventing said second voltage impulses from adversely affecting the operation of said second transistor.

3. Apparatus as claimed in claim 2, wherein said first and third resistors are voltage dependent resistors whose resistance decreases as the voltage thereacross increases, and said second resistor is a current dependent resistor whose resistance decreases with increasing current flowing therethrough.

4. In a transistorized electron beam deflection circuit for a television receiver in combination, a driver stage having a first transistor with base, collector and emitter electrodes;

means connected to said base electrode of said first transistor for alternately rendering said transistor conductive and nonconductive;

a first resistor connected to said collector and emitter electrodes of said first transistor, said first resistor having a nonlinear resistance characteristic;

an inductively loaded output stage having a second transistor with base, emitter and collector electrodes, said base electrode of said second transistor being connected in circuit with said collector electrode of said first transistor for respectively rendering said second transistor conductive and nonconductive in response to the conductive and nonconductive conditions of said first transistor whereby said inductive output stage develops first voltage impulses at a rate related to the conductive and nonconductive periods of said second transistor and is further subject to the development of randomly occurring second voltage impulses having an amplitude substantially higher than the amplitude of said first voltage impulses;

peak detecting means connected in circuit with said collector electrode of said second transistor for developing a voltage having an amplitude related to the amplitude and repetition rate of said first voltage impulses;

protective circuit means including a second resistor having a nonlinear resistive characteristic connected to said collector electrode of said second transistor for preventing said second voltage impulses from adversely affecting the operation of said second transistor;

and current responsive fuse means connected in circuit with said collector electrode of said second transistor for preventing current flow through said second transistor after the current therethrough reaches a selected level.

References Cited by the Examiner

UNITED STATES PATENTS

| | | | |
|---|---|---|---|
| 2,884,545 | 4/1959 | Houck | 317—33 X |
| 3,030,444 | 4/1962 | Preisig | 178—7.3 |
| 3,047,742 | 7/1962 | Greening et al. | 328—9 X |
| 3,113,250 | 12/1963 | Wood | 317—148.5 |
| 3,128,392 | 4/1964 | Jones | 328—171 X |
| 3,165,666 | 1/1965 | Rickling | 315—27 |
| 3,185,889 | 5/1965 | Attwood | 315—27 |

MILTON O. HIRSHFIELD, *Primary Examiner.*

LEE T. HIX, *Examiner.*

D. YUSKO, *Assistant Examiner.*